United States Patent [19]

Nolte, Jr.

[11] Patent Number: 4,914,811
[45] Date of Patent: Apr. 10, 1990

[54] MACHINE FOR MINISPRING SOCKET INSERTION

[75] Inventor: Edward F. Nolte, Jr., Middletown, Pa.

[73] Assignee: AMP Incorporated, Harrisburg, Pa.

[21] Appl. No.: 866,181

[22] Filed: May 21, 1986

[51] Int. Cl.⁴ .............................................. B23P 19/00
[52] U.S. Cl. ........................................ 29/747; 29/739; 29/844; 29/845; 227/136
[58] Field of Search ................. 29/845, 739, 747, 899; 227/134, 136, 149

[56] References Cited

U.S. PATENT DOCUMENTS

| | | | |
|---|---|---|---|
| 3,538,581 | 11/1970 | Collins et al. | 29/739 X |
| 3,571,924 | 3/1971 | Collins | 29/844 |
| 3,574,935 | 4/1971 | Berg | 29/844 |
| 3,613,213 | 10/1971 | Landmon et al. | 29/739 X |
| 3,641,647 | 2/1972 | Balmer | 29/739 X |
| 3,938,245 | 2/1976 | Lovendusky et al. | 29/739 |
| 3,975,811 | 8/1976 | Meyer | 29/739 |
| 4,188,704 | 2/1980 | Gavin | 29/739 X |

FOREIGN PATENT DOCUMENTS 1330196  9/1973  United Kingdom .

Primary Examiner—Howard N. Goldberg
Assistant Examiner—Carl J. Arbes
Attorney, Agent, or Firm—Adrian J. LaRue

[57] ABSTRACT

A machine for inserting electrically conducting miniature spring sockets into holes of a printed circuit board without any damage to the circuit board, yet providing sufficient lateral movement to accommodate slight misalignments during the insertion process.

13 Claims, 11 Drawing Sheets

MACHINE FOR MINISPRING SOCKET INSERTION

This invention relates to a machine for inserting electrically conducting miniature spring sockets into a printed circuit board for subsequent insertion in these sockets of appropriate circuit board elements. More particularly, this invention relates to a machine which inserts with great assurance and precision these electrically conducting miniature spring sockets in a printed circuit board without damage being done to the board during the insertion, such as previously encountered with available prior art machines.

Still further, this invention relates to a machine which is especially adapted for an unlimited and limited number of miniature spring socket insertions. For example, this machine is adaptable for the insertion of miniature spring sockets of great number based on an X and Y direction controlled table.

BRIEF DESCRIPTION OF PRIOR ART

An electrically conducting miniature spring socket suitable for use in the presently disclosed machine has been described in prior art such as U.S. Pat. No. 3,803,537. These miniature spring sockets are especially suitable for insertion in a printed circuit board and have become widely used and have found a great number of applications. When these miniature spring sockets are being mounted within a printed circuit board, a precise insertion of these is necessary in the holes provided in the printed circuit board so that the board integrity and printed circuit reliability are not affected by an unreliable insertion process. When using the prior art machines, it has been found that upon a misalignment, because of the holes in the printed circuit board or as a result of an insertion action, damage to the printed circuit board occurs which requires that the printed circuit board be scrapped or repaired at a prohibitive cost which renders the manufacturing process very economically unattractive.

A number of process and machine design attempts have been made to improve the insertion process so as to assure greater reliability, but the problems still have persisted. Moreover, when inserting a limited number of miniature spring sockets in a part-finished printed circuit board, the location process, as well as the location means used, require considerable time for proper location and insertion with reliability being less than satisfactory.

BRIEF DESCRIPTION OF THE INVENTION

It has now been found that a machine for insertion of the miniature spring sockets eliminates and/or minimizes prior art problems, such as entirely eliminating the possible damage being done to the semifinished printed circuit board, at the same time improving the production rate because of the greater assurance and reliability experienced with this machine during the insertion process.

Still further, the ease of operation, such as locating the holes in the printed circuit board, as well as precisely inserting the miniature spring sockets in the holes, has reduced considerably the scrap rate heretofore encountered with the prior art devices.

According to the present invention, a machine for insertion of electrical sockets into holes of a circuit board comprises frame means, guide means on the frame means along which a carrier strip carrying electrical sockets is guided, feed means on the frame means for feeding the carrier strip along the guide means and for positioning the electrical sockets in position in the guide means for insertion into selected holes in the circuit board. Insertion means is mounted on the frame means and is associated with the guide means for inserting the electrical sockets in the circuit board. The insertion means includes ram means, operating means operatively connected to the ram means for moving the ram means from a rest position to an insertion position, movable guide means into which an electrical socket is disposed after being removed from the carrier strip by the ram means, the movable guide means being moved from a first position to a second position as the electrical socket and the ram means are moved along the movable guide means, and means on the movable guide means to release the electrical socket therefrom so that the ram means inserts the electrical socket in the circuit board hole.

According to another aspect of the present invention, the operating means includes sensing means to sense obstruction of ram means movement causing the ram means to return to its initial operating position without the ram means damaging the circuit board.

DETAILED DESCRIPTION OF THE INVENTION AND THE EMBODIMENTS THEREOF

Turning now to the drawings herein which illustrate by way of example the present invention, various advantages and benefits will become readily apparent upon the review of these drawings in combination with the detailed description and embodiments, and wherein in the drawings.

Figure 1:
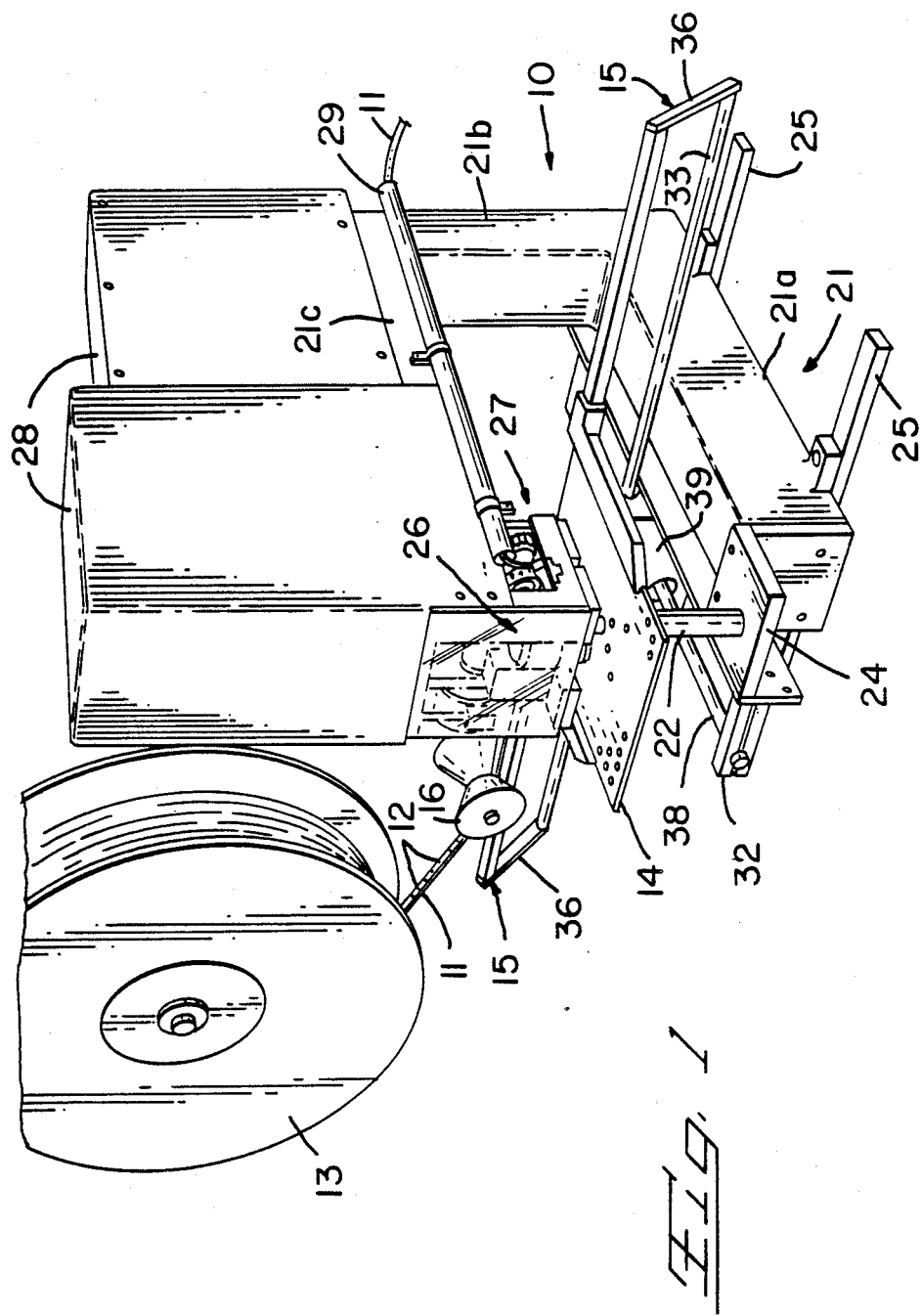
FIG. 1 is an isometric view of the machine according to the present invention.

Turning now to FIG. 1, the machine for miniature spring socket insertion has been shown as 10 with the miniature spring socket carrier strip as 11 and a miniature spring socket as 12. These miniature spring sockets will hereinafter be also termed as "minispring sockets" for sake of economy of description.

A reel 13 for the minispring socket carrier strip 11 has been shown with the guide roller 16 used with the strip carrier 11.

A printed circuit board has been identified as 14. An X and Y directionally articulated guide frame for the PC board 14 has been shown as 15. As will be further described herein, the guide frame 15 is for guiding and locating in the PC board the holes for insertion, at a suitable location, of a minispring socket.

A frame for the machine, identified as a C frame 21, is comprised of a base 21a, a post 21b and a cantilever arm 21c. A pin locator assembly for the PC board hole location has been shown as 22. An assembly support bracket 24 for pin locator assembly 22 has also been shown in FIG. 1.

Base extenders 25 for the C frame base 21a have been illustrated in FIG. 1. Further in FIG. 1, insertion mechanism for the minispring socket has been identified as 26 with the advance mechanism 27 being shown for the minispring socket carrier strip 11; housing 28 covers these mechanisms, including the appropriate pneumatic and electrical supply lines therefor.

Figure 2:
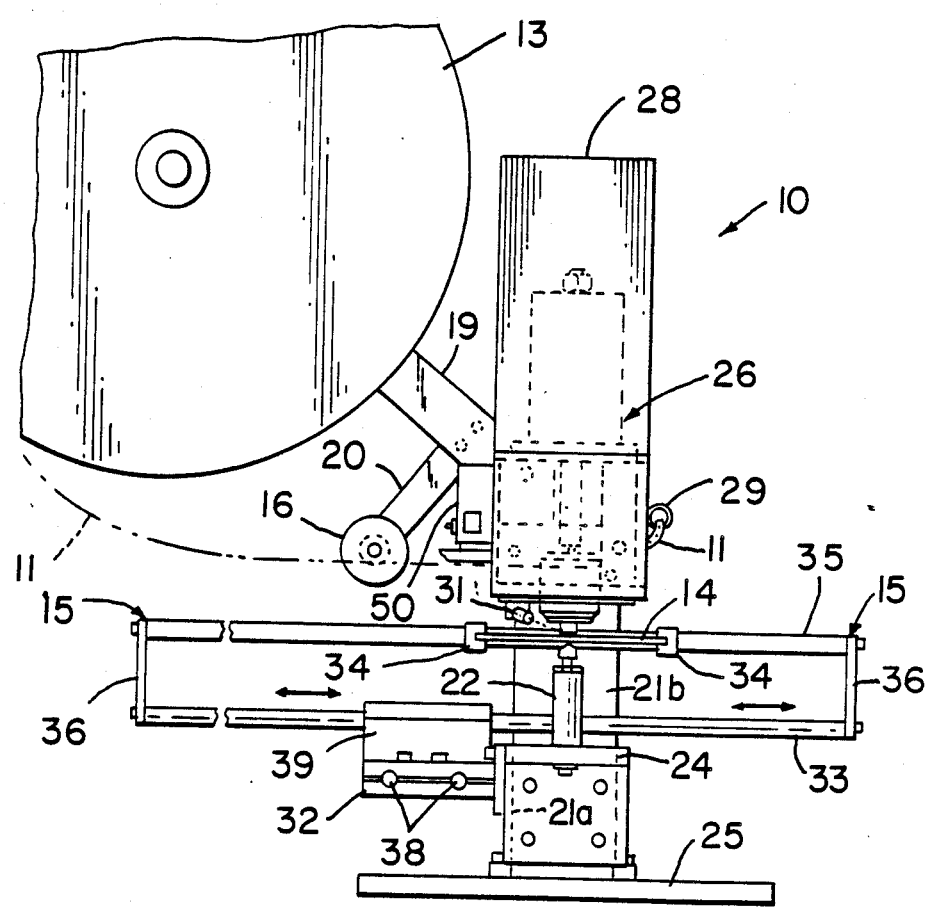
FIG. 2 is a partfront view of the machine as shown in FIG. 1.

Turning now to FIG. 2, it illustrates, in addition to the items shown in FIG. 1, a bracket 19 for the minispring socket carrier strip reel 13 and a bracket 20 for the minispring socket carrier strip guide roller 16.

Additionally, pneumatically operated cylinder 50. Also shown in FIG. 4, forms part of the advance mechanism 27 for minispring socket carrier strip 11 advance. A light 31 is shown in FIG. 2 for aiding the operator for locating manually a hole in the printed circuit board.

Figure 3:
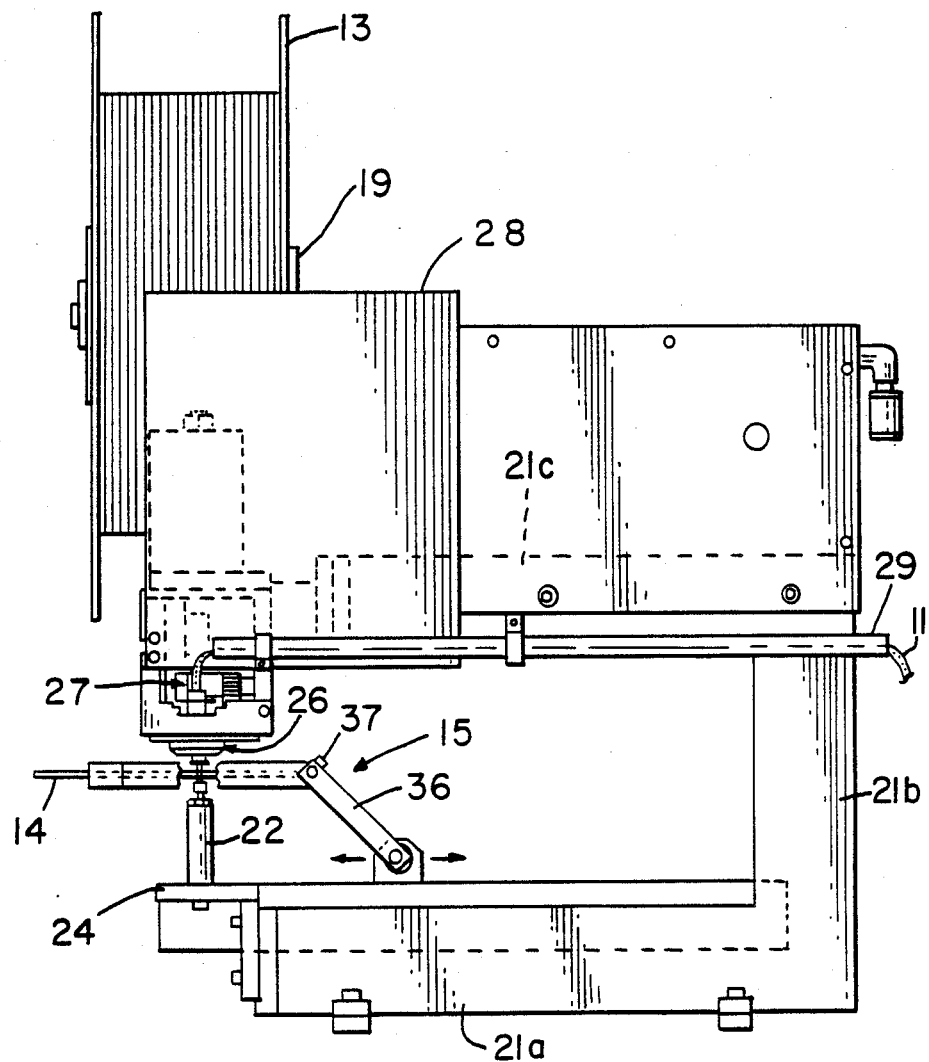
FIG. 3 is a side view from the right side of the machine as shown in FIG. 1.

A bracket 32, shown in FIG. 2, is affixed to base 21a of the C frame 21 and houses lower rod 33 for articulating the X and Y frame 15 and for moving rod 33 both forwardly and rearwardly and for allowing lower rod 33 to slide from left to right or vice versa. Left and right guide channels 34 mounted on upper rod 35 allow a PC board 14 to be moved with rod 33 from left to right or vice versa, with the articulating arms 36 allowing an alignment for movement to be along the X axis. Guide channels 34 may, of course, be positioned along rod 35 by set screw means 37, as shown in FIG. 3.

In place of a manual X and Y guide means described above, an electronically guided table may be substituted, such that an automatic positioning of the X and Y plane is achieved without substantial operator guidance, except such as for insertion and removal of the printed circuit board.

As shown in FIGS. 1 and 2, guide rods 38 allow the lower rod 33 for the articulated frame 15 to move forwardly and backwardly, at the same time allowing the left-hand and right-hand guide channel brackets 34 and articulated frame 15 to be moved in the Y direction, that is, towards the left or right within the housing 39 for the lower rod 33.

Figure 4:
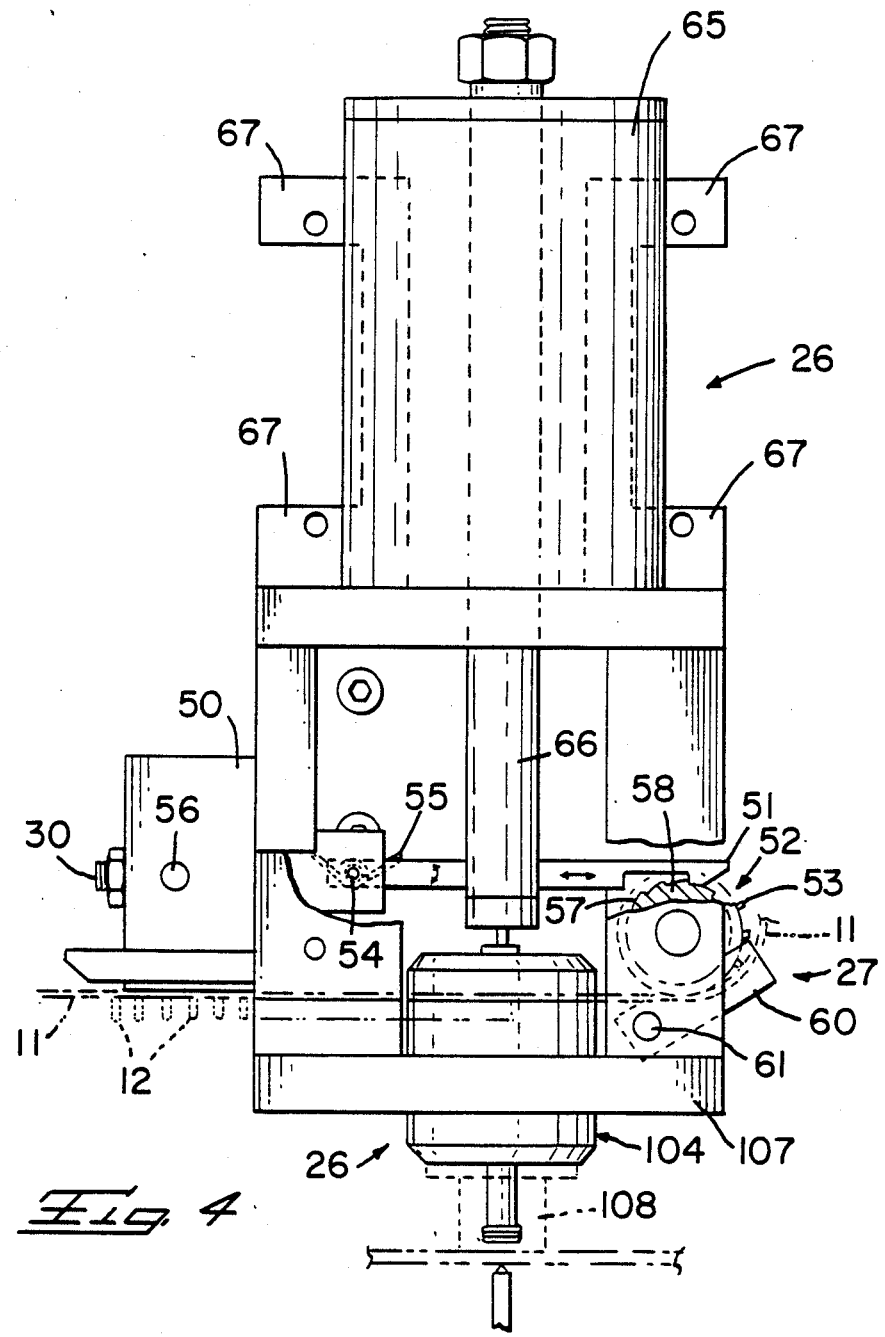
FIG. 4 is a front view showing a subassembly of the insertion and advance mechanism for the machine as described herein.
Figure 5:
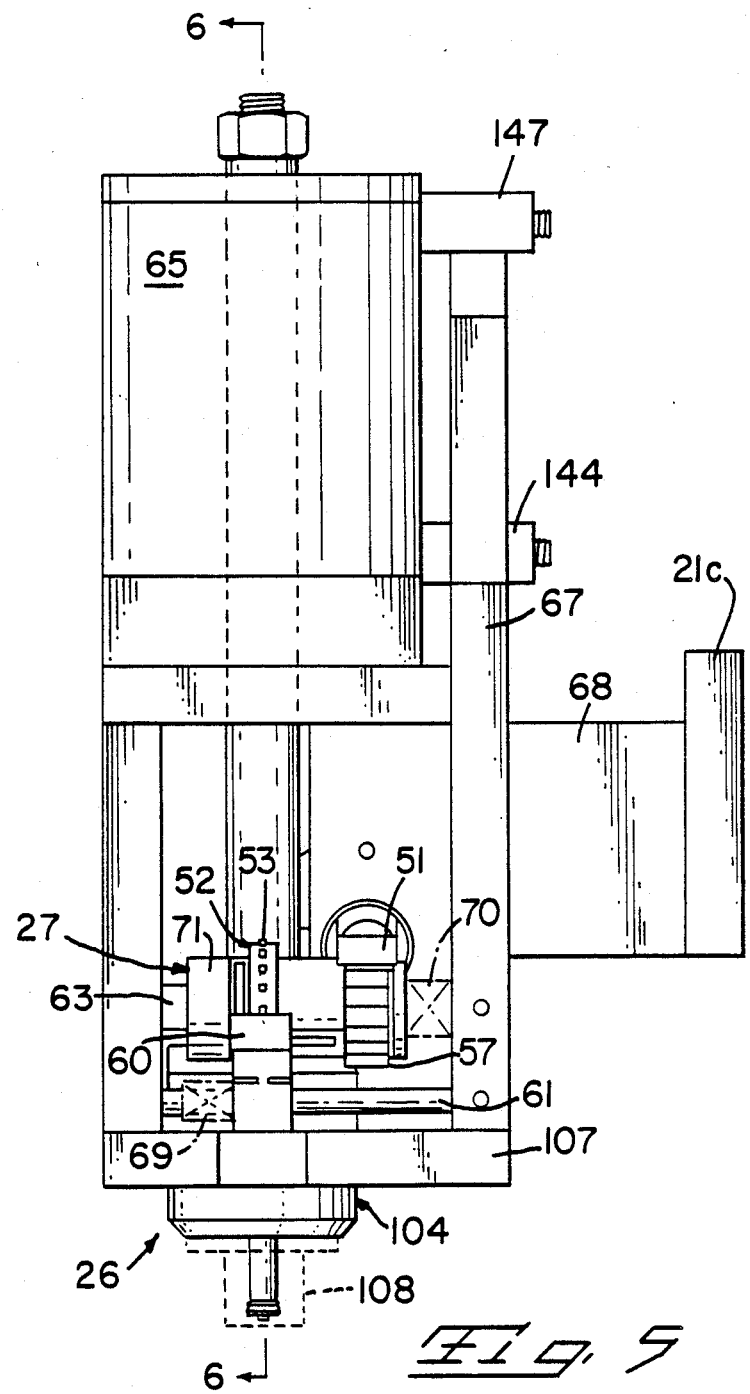
FIG. 5 is a partside view of the right-hand side of the subassembly as illustrated in FIG. 4 for the insertion mechanism.

Turning now to FIGS. 4 and 5, these illustrate the front and right-hand side views of the insertion and advance mechanisms 26 and 27, respectively. Describing now first the advance mechanism 27 for the minispring socket carrier strip 11, advance mechanism 27 consists of a pneumatically operated cylinder 50 which operates a reciprocating pawl arm 51 which, upon each stroke, advances the index wheel 52 counterclockwise by an appropriate distance. As there are a number of differently sized minispring sockets, advance of the pawl arm 51 may be suitably adjusted by means of cylinder adjusting screw 30. Moreover, if standardized spacing is used for index holes in the carrier strip 11, only one index wheel 52 is required. The index wheel 52 carries index sprockets 53 which engage appropriate index holes (not shown) in the carrier strip 11 and advance the carrier strip with the minispring sockets 12 carried therein into an appropriate position for insertion by the insertion mechanism 26.

Figure 7:
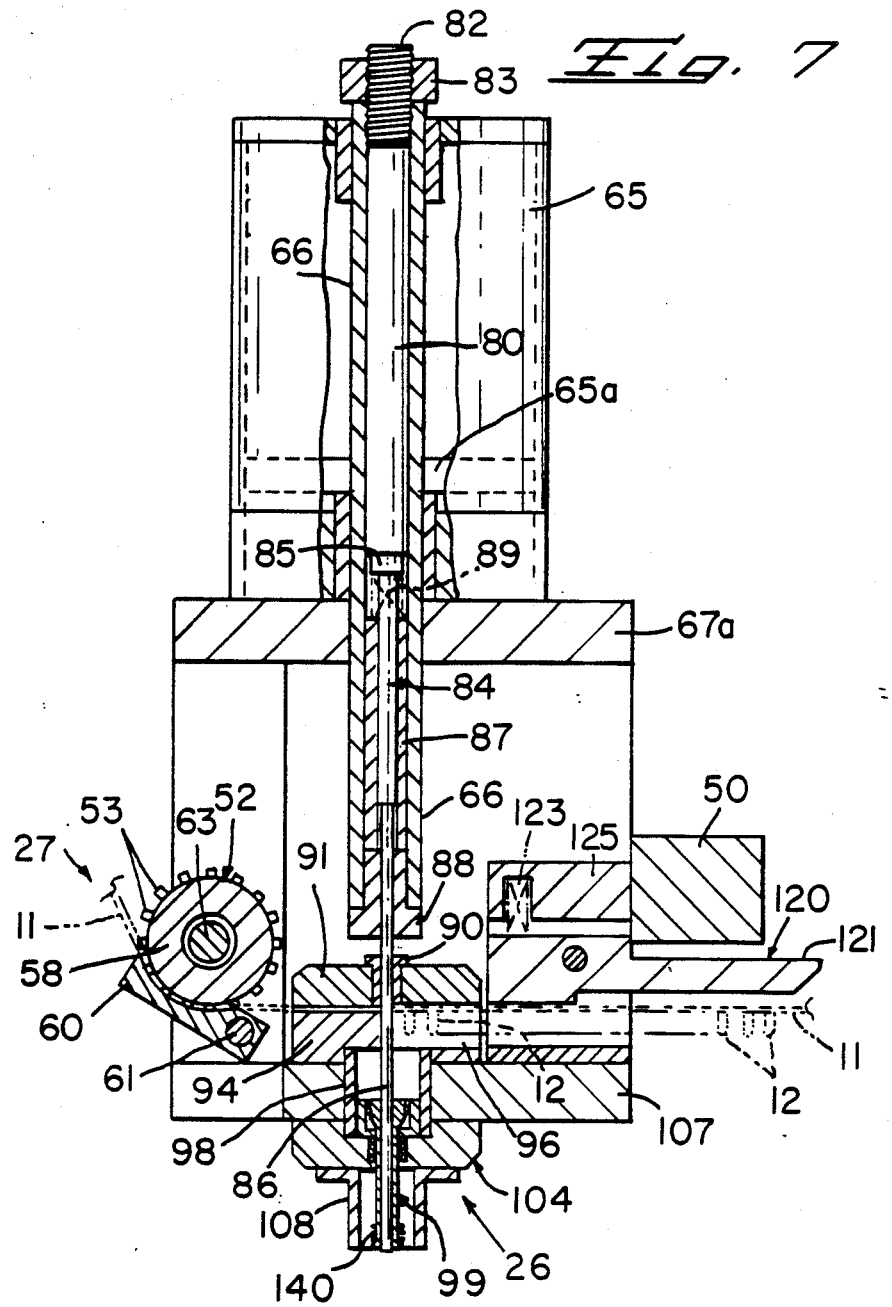
FIG. 7 is a cross-sectional view similar to FIG. 6, showing the insertion mechanism and an insertion "complete" cycle.

The pawl arm 51 is pivoting at point 54 and held latched by spring 55, thereby positively engaging teeth 57 on the pawl gear wheel 58 driven by cylinder 50. Upon each left-hand stroke as shown in FIG. 4, the carrier strip 11 is advanced by an appropriate distance. when pawl arm 51 engages the teeth 57 on pawl gear wheel 58. The index wheel 52 is coupled to the pawl gear wheel 58 with a block 60 urging (by a spring, 69 shown on FIG. 5) the carrier strip against the index wheel 52 so that the sprockets 53 are at all times in a positive engagement with the holes in the carrier strip 11. Further details of this guide block 60 are shown in FIG. 7. The pivot shaft 61 for guide block 60 has been shown in FIGS. 4 and 5. The entire index wheel 52 and pawl gear 58 assembly rotates on shaft 63.

Turning now to FIG. 5 and further details of the advance mechanism 27, this Figure illustrates spring 69 for the guide block 60 mounted on shaft 61 therefor. Similarly, for the index wheel shaft 63, a positioning spring 70 is shown. Holding pawl gear wheel 58 against collar 71 thereby aligning carrier strip 11 with ram 84. A mechanical slip clutch not shown as part of pawl gear 58 prevents carrier strip 11 from moving backward.

Bracket 67 thus has mounted on it the advance mechanism 27, as well as the insertion mechanism 26. In turn, bracket 67 is affixed to bracket 68 which, again in turn, is attached to the C frame cantilever arm 21c.

Figure 8:
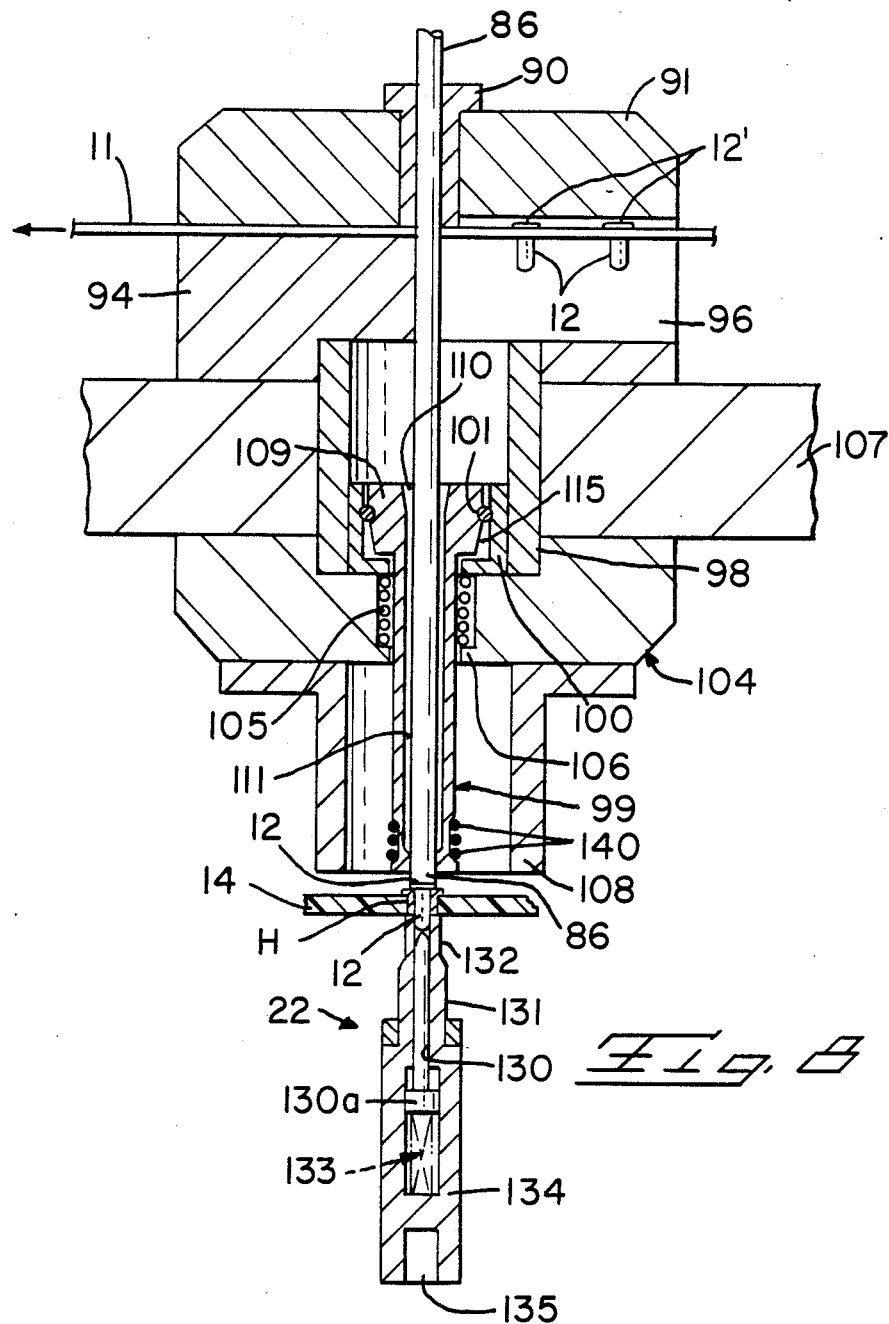
FIG. 8 shows in greater detail part of the insertion mechanism shown in FIG. 7 at the insertion "complete cycle", including the illustration of a locator pin assembly.
Figure 9:
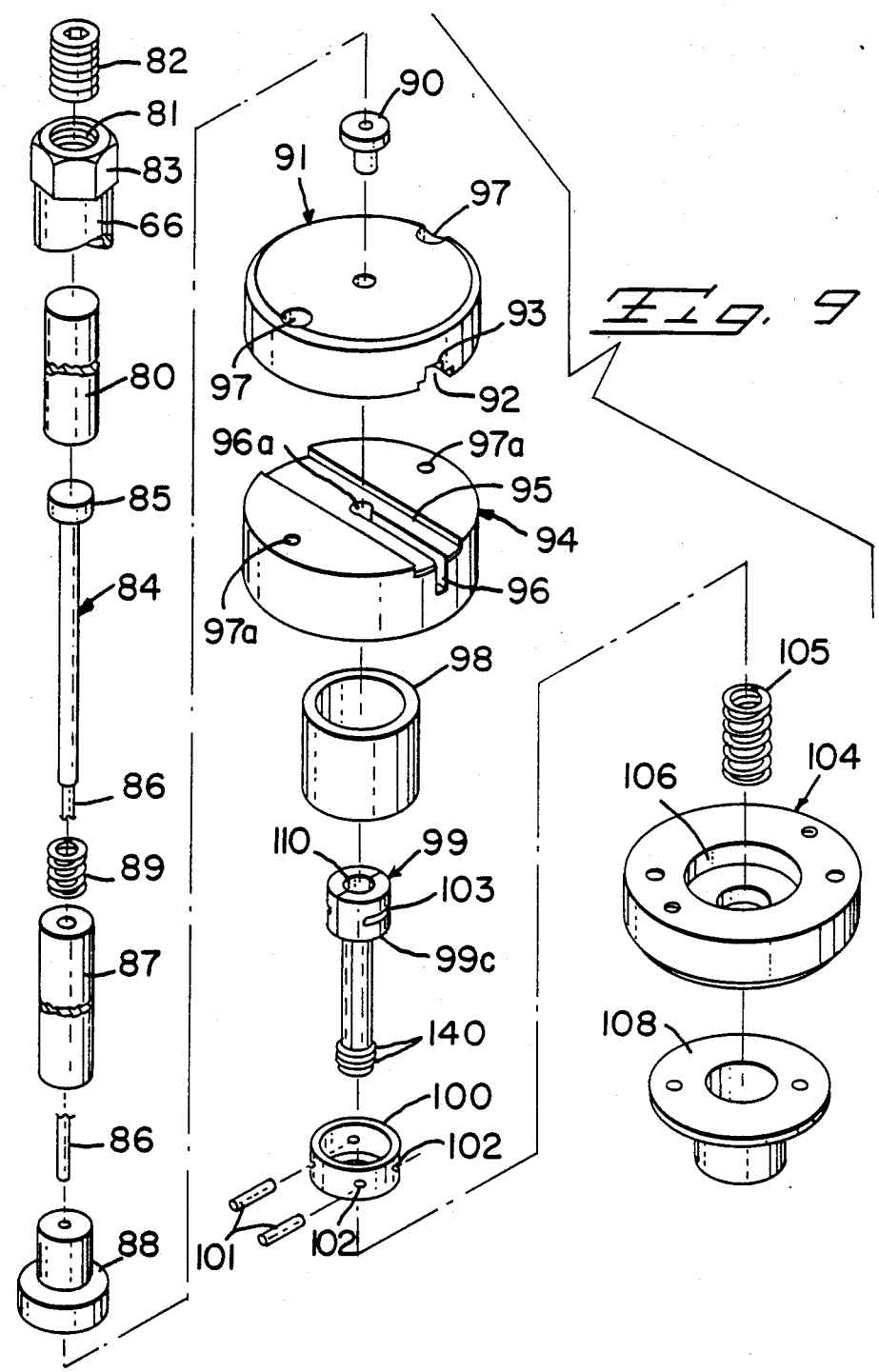
FIG. 9 is an assembly drawing of the insertion mechanism showing the component parts and their assembly for the insertion mechanism, as well as guide means associated therewith.

Pneumatic cylinder 65 houses a reciprocating rod 66 and piston 65a which will be further described in connection with the description of FIGS. 6, 7 and 8, and constitutes the insertion mechanism 26, the assembly drawing for which is shown in FIG. 9.

Before turning to FIGS. 6 and 7, in order to help in the understanding of FIGS. 6, 7 and 8, the assembly drawing shown in FIG. 9 will now be discussed.

Rod 66 reciprocates internally, centrally and axially in the pneumatic cylinder 65 via piston 65a secured to rod 66. Rod 66 is hollow and contains within it insert rod 80 which is fed into the rod 66 through the opening 81 and which, in turn, is closed thereafter with set screw 82 in lock nut 83. Insert rod 80 in turn drives insert ram 84, consisting of ram head 85 and ram shaft 86. The ram shaft 86 is guided by ram shaft guide 87 and supported by ram shaft guide support 88. Thus the insert rod 80 and the insert ram 84, as well as the ram shaft guide 87 and the ram shaft guide support 88, are all mounted within the pneumatic rod 66. In order to facilitate adjustments so as to accommodate differences in length of ram 84, a spring 89 for ram 84 is provided to ride between the shoulders of ram shaft guide 87 and insert ram head 85.

Ram shaft 86, in turn, is guided into the feed guide 91 by feed guide bushing 90 mounted axially and centrally in the feed guide 91.

Feed guide 91 contains a carrier strip guide channel 92 in the form of an inverted "T", with the stem of the "T" 93 providing a guide channel for the minispring socket head.

The strip guide 94 contains a channel complementary to channel 92, identified as 95, which has a minispring socket guide channel 96 for the minispring socket 12. As the carrier strip 11 is advanced, the guide bushing 90 for ram shaft 86 thus positions the ram shaft 86 over each individually advanced minispring socket in precise position without allowing the carrier strip 11 to be advanced any further.

Feed guide 91 in turn is mounted on strip guide 94 by means of appropriate screws through apertures 97 of feed guide 91 and through apertures 97a of strip guide 94 into threaded apertures in feed bracket plate 107 shown in FIG. 5. A bushing 98 allows inserter guide 99 to ride in it upwardly and downwardly upon each stroke of insert ram shaft 86, as guided by an interior insert guide bushing 100.

Figures 10, 11:
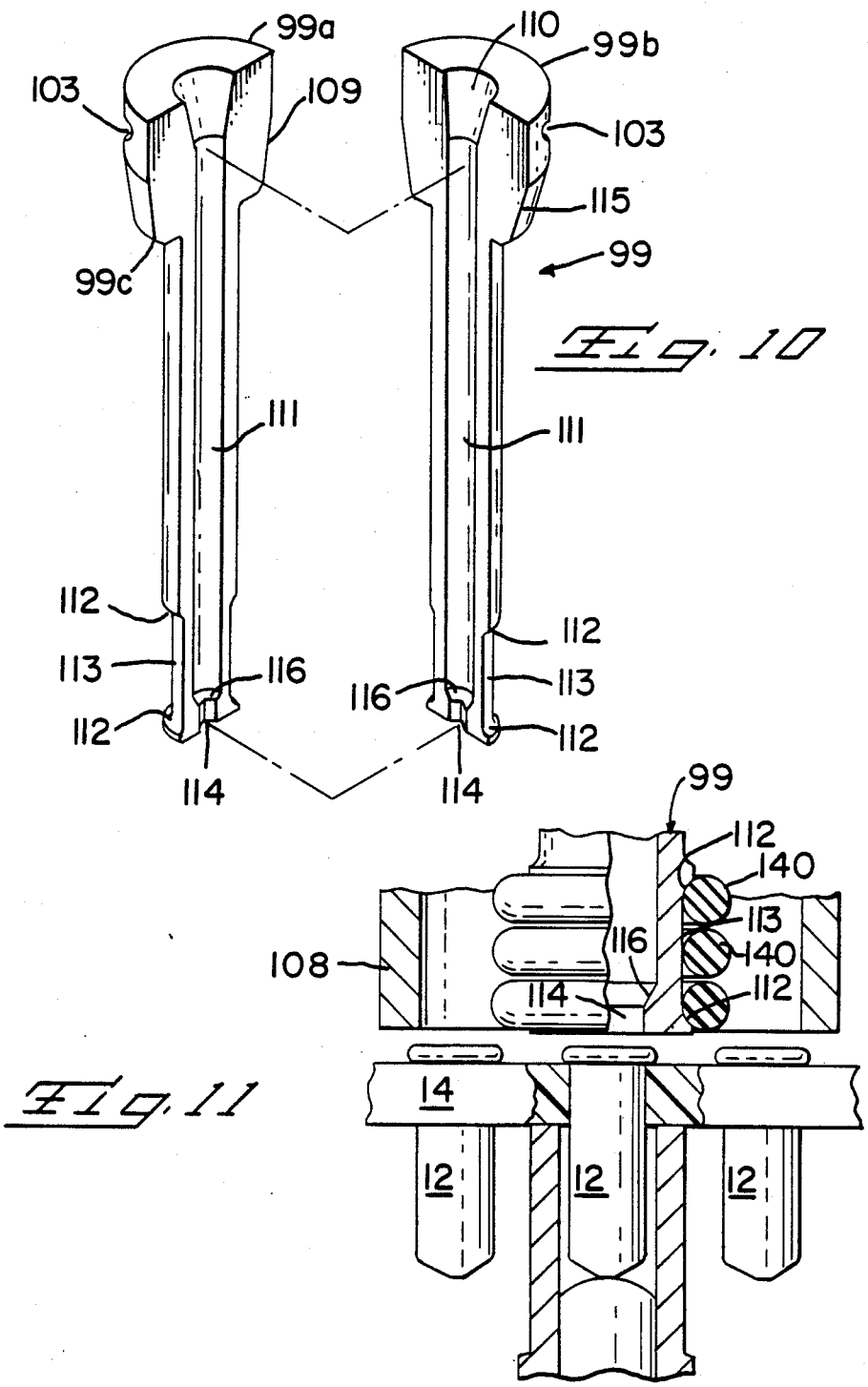
FIG. 10 is a cross-sectioned subassembly view of the inserter guide component shown in FIG. 9.
FIG. 11 shows in a part magnified view the insert guide, including a miniature spring socket after insertion in a printed circuit board during the completion of the insertion cycle.

Thus, inserter guide 99 comprises two axially meeting mirror image halves 99a and 99b in FIG. 10 and which are held together at the upper half by a cup-shaped interior insert guide bushing 100, containing two pins 101 fitted in apertures 102 in interior guide bushing 100 and which pins then restrain inserter guide 99 by engaging pins 101 in pin channels 103 in inserter guide 99, yet allowing some slight freedom for movement. In turn, on the two halves 99a and 99b at the bottom of inserter guide 99, a number of elastomeric O-rings 140, as best shown in FIG. 11, restrain inserter guide 99 from unduly splaying, yet allow some positive gripping of each minispring socket. In FIG. 11, three O-rings 140 have been shown. Of course, these may be replaced by appropriate springs, e.g., spring C rings, etc.

In turn, bushing 98, including inserter guide 99 and interior bushing 100, are placed into tube guide stop 104 with inserter guide 99 being restrained by spring 105 abutting the bottom of cup-shaped interior bushing 100. At the lower portion, spring 105 is restrained by indent shoulder 106 in tube guide stop 104. The assembly, beginning with guide bushing 90 and up to tube guide stop 104, is also shown in cross section in FIG. 7 with ram shaft 86 being in the insertion "complete" position. Further, the assembly, beginning with guide bushing 90 and tube guide stop 104, is mounted on feed bracket plate 107 which constitutes the bottom plate of bracket 67 shown in FIG. 5. A guard 108 for inserter guide 99 is shown in FIGS. 6 and 7, and in FIG. 8, and is a safety precaution.

In FIG. 10, the two halves 99a and 99b of insert guide 99 are shown and are mirror halves of each other. Inserter guide 99 thus includes inserter guide head 109 which contains pin channels 103. Inserter guide 99 has a conically shaped opening 110 for ram shaft 86 as it drives into and through inserter guide 99 minispring socket 12.

Central channel 111 for inserter guide 99 thus accommodates the minispring socket, as well as ram shaft 86 with ram shaft 86 in its downstroke transversing the entire length of inserter guide 99, as will be further discussed herein.

Between shoulders 112 at the bottom of inserter guide 99 are mounted an appropriate number of elastomeric O-rings 140 shown in FIGS. 9 and 11. As mentioned before, these O-rings 140 prevent inserter guide 99 from being unduly splayed during the insertion cycle of the minispring sockets, although these O-rings 140 allow the two halves to splay slightly as the head of the socket passes through opening 114 at the bottom of inserter guide 99. This also provides for some safety in the event there is an improper insertion or some improperly oriented minispring socket in channel 111 or during the insertion stage in the printed circuit board for a socket that is slightly out of alignment with a hole in the printed circuit board in which the minispring socket is to be inserted.

Thus the necked-down part 113 of inserter guide 99, holding O-rings 140 in combination with pins 101 holding inserter guide head 109, provide for considerable movement, relatively speaking, for ram shaft 86, as well as a minispring socket 12 as they are moved through inserter guide 99. During the insertion cycle of each of minispring sockets 12, inserter guide 99 has enough movement to accommodate displacement. Thus, inserter guide 99 has a capability to accommodate sideway movements by the pivoting on pins 101 in the interior of bushing 100 and due to the conically-shaped portion 115 of inserter guide head 109 as shown in FIG. 10.

Figure 6:
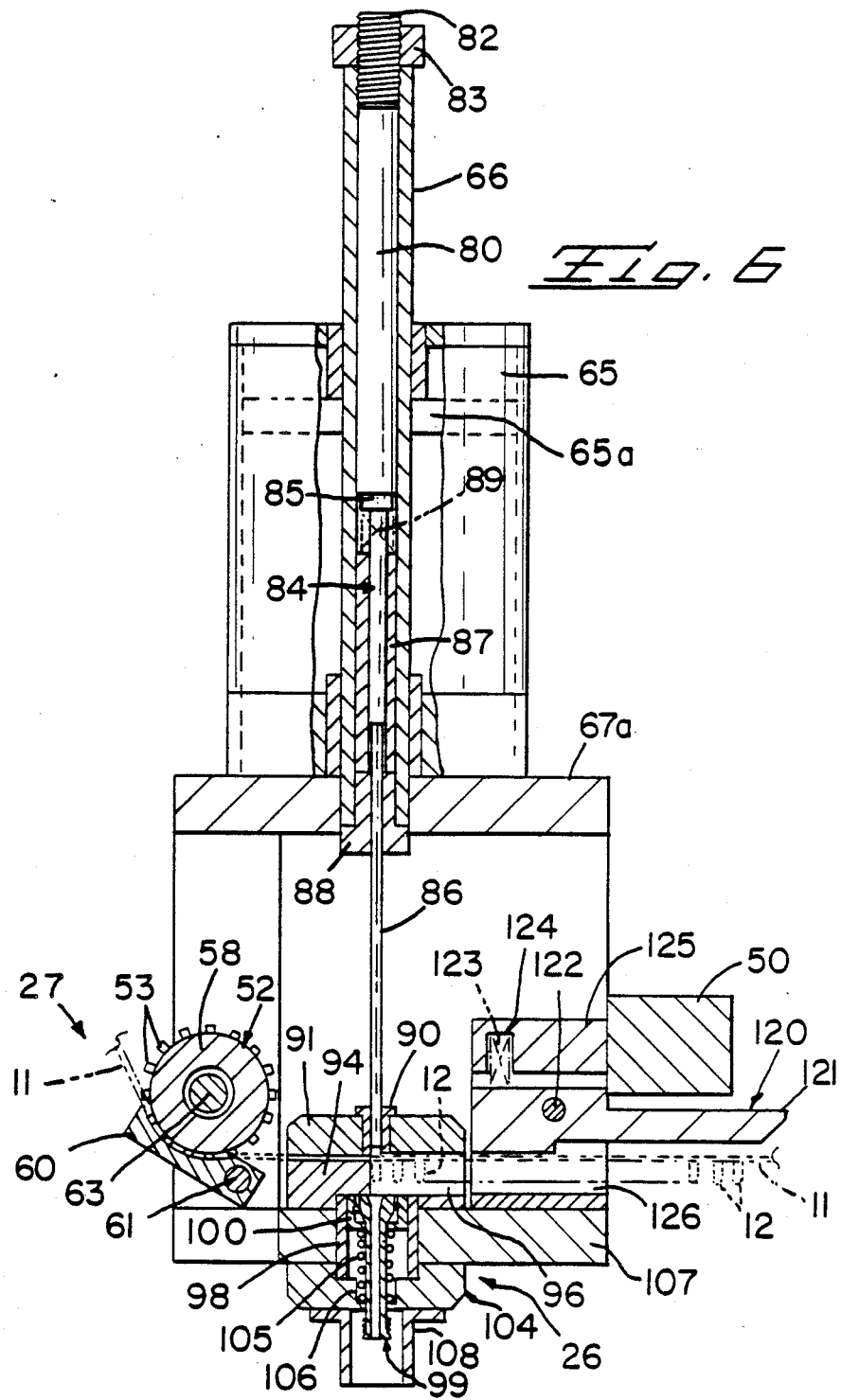
FIG. 6 is a cross-sectional view along lines 6—6 of FIG. 5, illustrating in greater detail the insertion mechanism in an insertion "begin" cycle.

With reference to FIGS. 6, 7 and 8, which illustrate in cross section the insertion sequence of a minispring socket, as well as the operation of the insertion mechanism 26, and with reference to FIG. 9 for the understanding of the entire insertion assembly, FIG. 6 illustrates the insertion ram 84 with the pneumatic cylinder rod 66 being in the up position. Rod 66 reciprocates positively up and down driven by the pneumatic cylinder 65.

Within rod 66 is inserted insert rod 80 which has an adjustable feature, by means of set screw 82, threaded in lock nut 83 and mounted on rod 66. The entire assembly thus reciprocates up and down through the opening in plate 67a which forms part of bracket 67. Insert rod 80 thus drives ram 84 by bearing against ram head 85 with spring 89 absorbing the shock on each up stroke of cylinder rod 66.

Ram shaft 86 is guided in ram shaft guide 87, although ram shaft 86 is primarily supported as it exits from the cylinder by ram shaft guide support 88. Upon the up stroke of rod 66, ram shaft 86 still resides in guide bushing 90 and is thereby positioned over one of minispring sockets 12 which is positioned in strip guide slot 96. Strip guide slot 96 has at the end an enlarged opening 96a, as best shown in FIG. 9, for ram shaft 86 to move freely in opening 96a and through conical opening 110 of inserter guide 99 shown in FIG. 10. This insert "begin" cycle thus finds inserter guide 99 as urged by spring 105 bearing against the bottom of cup-shaped interior bushing 100, pushing upwardly interior bushing 100 and with it inserter guide 99 until it abuts in bushing 98 against strip guide 94. As rod 66 now moves in the down stroke, minispring socket 12 is forcibly pushed by ram shaft 86 through carrier strip 11 which is typically of Mylar or suitable plastic material having some resiliency for removal purposes. Minispring socket 12 is pushed into conical opening 110 of inserter guide 99, moving along inserter guide channel 111, as shown in FIG. 8, and protruding slightly through the bottom opening 114 of inserter guide 99, as shown in FIG. 10.

Ram shaft 86, as it now moves downwardly, pushes entire inserter guide assembly 99 with the minispring socket in channel 111 with interior bushing 100 traveling in outer bushing 98.

Tapered surface 116 at the bottom of inserter guide 99, however, is engaged by ram shaft 86 camming the two halves of inserter guide 99 open against the bias of O-rings 140 but preventing them from unduly splaying, thereby spreading apart inserter guide halves 99a and 99b.

As shown in FIG. 8, in the down stroke pins 101 including conically narrowed section 115 of inserter head 109, as well as the gaps in cup-shaped interior bushing 100, provide some lateral movement in all directions for inserter guide 99. Similarly, the gap at the bottom of tube guide stop 104 provides this lateral movement, and thus proper alignment of ram shaft 86, upon the completion of the down stroke, is accommodated at all times.

Turning now to FIGS. 6 and 7, drag means 120 exerts pressure on strip 11 which assures that strip 11 is being fed by index wheel 52 properly into strip guide 94. Drag means 120 comprises a drag lever 121 pivotally mounted on pin 122. Bearing against drag level 121 is a spring 123 housed in a hole 124 in a bracket 125 which, in turn, is mounted on inserter bracket 67.

A complementary guide channel 126 supporting strip 11 is located in bracket 125, is in alignment with guide channel 96 in strip guide 94 and allows drag level 121 to exert force on strip 11.

Returning now to FIG. 8, it illustrates locator pin assembly 22, also shown in FIG. 1, with a locator pin 130 and a locator pin bushing 131.

Locator pin bushing 131 has a narrowed down section 132 which allows for close spacing for insertion of the minispring sockets and support, during the insertion cycle, of printed circuit board 14.

Locator pin 130 is at all timed urged upwardly by spring 133 bearing against locator pin head 130a.

In turn, locator pin spring 133 is housed in a suitably adjustably housing 134, the adjustment for which may be a set screw and lock nut (not shown); the set screw being disposed in blind hole 135 of housing 134.

For each insertion operation, the insert "begin" cycle may be initiated upon the locator pin 130 being seated in a hole in circuit board 14, either by an operator or by electronic means.

Figure 12:
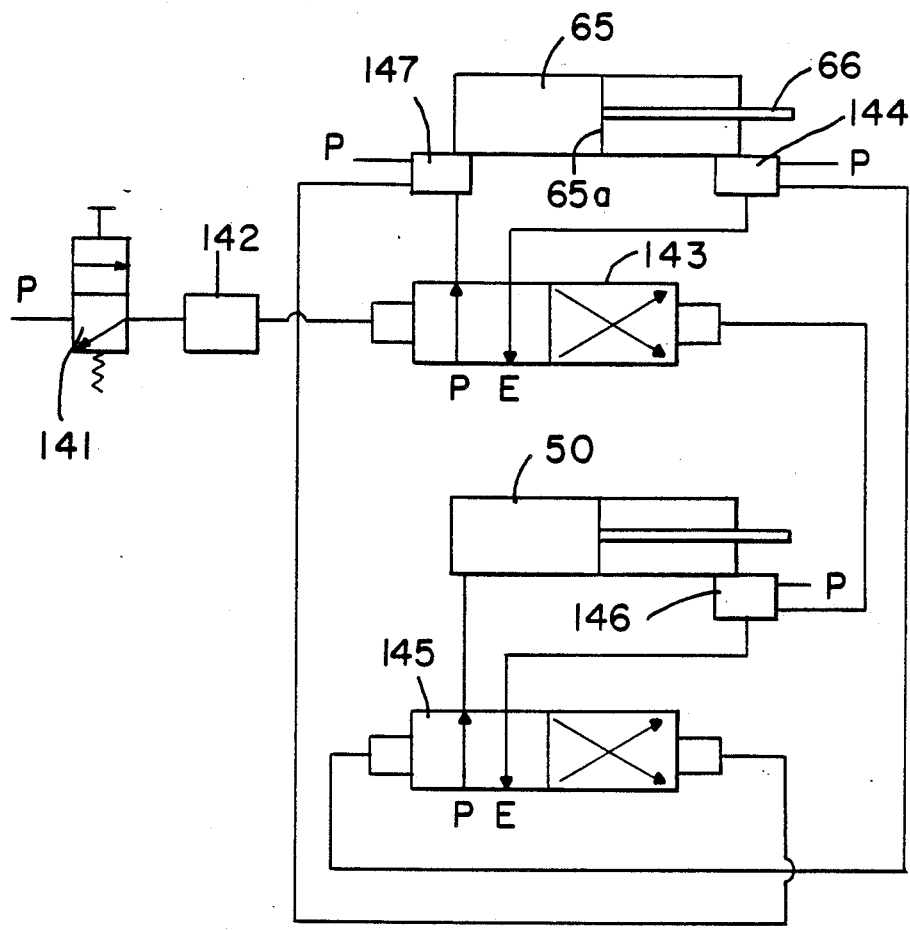
FIG. 12 is a schematic of the pneumatic circuit for operating the machine.

FIG. 12 illustrates the pneumatic circuit for operating machine 10. Air pressure P of about 80 PSIG is applied to a conventional operating air switch 141 which when actuated applies the air pressure to a conventional one shot value 142. Switch 141 is preferably a foot-operated switch. Upon pressure being applied to valve 142, a pulse of air pressure of approximately one second duration is applied to conventional four-way valve 143. This operates valve 143 to apply air pressure P to the down stroke of ram cylinder 65 causing operation of insert ram 84 to insert a socket 12 into a hole of board 14.

While piston 65a is moving in cylinder 65, the air flow restriction on the exhaust side of cylinder 65 will maintain some air pressure. When piston 65a slows to the point where the exhaust side air pressure drops below 10% of line air pressure, conventional threshold sensor 144 will transfer line air pressure to conventional four-way valve 145 which operates air cylinder 50 of the feed mechanism to plate it into position preparatory to feeding carrier strip 11 to its next position. When the piston of air cylinder 50 reaches is full travel, threshold sensor 146 will transfer line pressure P to valve 143 causing it to shift and apply line pressure to the up stroke side of air cylinder 65 thereby moving piston 65a to its up position. At this position, threshold sensor 147 transfers line pressure P to valve 145 applying line pressure P to the feed side of cylinder 50 causing the feed mechanism to advance carrier strip 11 thereby positioning the next socket 12 in its insertion position directly in line with insert ram 84.

The operating cycle will not be repeated until the external force is removed from switch 141 and switch 141 is again reactivated.

In the event that some obstruction prevents ram 84 from completing a full operating stroke such as, for example, missing a hole in the board, ram 84 will slow down to the point that threshold sensor 144 will function causing completion of the operation cycle of the machine before damage is caused to the board as heretofore described.

From the above description, it can be discerned that a machine has now been provided for very reliably and elegantly inserting minispring sockets, but especially miniature spring sockets in holes in a printed circuit board with the insertion being substantially error and damage-free with respect to a printed circuit board and the circuitry thereon. At the same time, the machine is capable of accommodating in sufficient degree any lateral displacement, either of the miniature spring socket 12, its location in the carrier strip 11, or a hole in a printed circuit board 14. Although the description has been in reference to miniature spring sockets, various other size sockets may be used, as the disclosed machine lends itself for ready adaptation to various sizes.

For controlling the operation of the machine, either in manual mode or when the X and Y table is controlled electronically, the various control circuits used are those typically used for this purpose, including devices such as proximity sensors, or "absence" or "presence" detecting means and the circuits therefor. These circuits are well known in the art. Likewise the pneumatic circuits, including the solenoids for controlling the valves used in the pneumatic circuits, are well known.

Having described the machine as well as the process for operating, the claims which follow are intended to cover the invention as disclosed herein and all reasonable equivalents thereof.

What is claimed is:

1. A machine for inserting electrical terminals mounted to a carrier strip into holes in a circuit board, the apparatus comprising:

a frame;

a carrier strip feed track on the frame;

a terminal driving insertion ram mounted to the frame for reciprocating movement towards and away from a terminal insertion station at one end of said feed track, for driving a terminal from said carrier strip into a hole in said circuit board;

a circuit board support aligned with said insertion station and the ram, for positioning the circuit board to receive a terminal to be driven into said hole in the circuit board by the ram;

a carrier strip advancing mechanism on the frame, for advancing the carrier strip intermittently towards said insertion station to position one terminal at a time at said insertion station, to be driven by the ram into said hole in the circuit board when positioned by said support; and an elongate tubular guide connected to the frame and through which the ram passes, for guiding said one terminal when driven by said ram from the insertion station into said hole, said tubular guide being longitudinally divided into a plurality of parts pivotally connected proximate to said insertion station, resilient means engaging said parts at a position remote from said insertion station and urging said parts towards each other against the action of said one terminal when driven towards the circuit board by said ram.

2. A machine according to claim 1, wherein said parts of the tubular guide cooperate to provide a head at the end of the tubular guide nearest to said insertion station, the head being received in a bushing in which each part of the tubular guide is mounted for limited pivotal movement transversely of the tubular guide.

3. A machine according to claim 2, wherein an end portion of the tubular guide remote from the head is surrounded by resilient rings urging said parts towards one another.

4. A machine according to claim 2, wherein pins extending through the bushing are received in channels in the head to provide fulcrums for said pivotal movement of the parts of the tubular guide, the head being mounted with clearance in the bushing.

5. A machine according to claim 2, wherein the bushing is slidable in a second bushing and is urged towards said insertion station by spring, the ram having a starting axial position in which it is withdrawn from the tubular guide to a location beyond said insertion station, the spring urging the first mentioned bushing and the head, in said starting axial position of the ram, against a stop proximate to said insertion station, and the ram, as it moves through the tubular guide driving the latter along the second bushing towards said board support against the action of said spring.

6. A machine according to claim 5, wherein said stop is constituted by a strip guide for the carrier.

7. A machine according to claim 1, wherein the end of the tubular guide remote form the said insertion station is internally restricted.

8. A machine according to claim 1, wherein the ram is driven by a piston and cylinder unit having a hollow piston rod containing an insert fixed in the piston rod, the piston rod also having therein a guide sleeve receiving the ram with a head of the ram between the guide sleeve and the insert, a shock absorbing spring acting between the ram head and the guide sleeve.

9. A machine according to claim 1, wherein said circuit board support is carried by a frame comprising a pair of circuit board guide channels spaced from one another to receive the said support between them, each guide channel being carried by a first rod, said first rods extending in a direction away from one another, each first rod being articulated to a second rod extending parallel to the first rods, the second rod being mounted for movement along a first axis and also being mounted for movement along a second axis extending at right angles to the first axis, the articulation between the first rods and the second rod being such as to allow fine adjustment of said support along said axes for aligning the hole in the circuit board with the ram.

10. A machine according to claim 1, wherein said advancing mechanism comprises a sprocket wheel mounted for rotation about the axis of a shaft and carrying sprockets for engaging in index holes in said carrier strip, a ratchet wheel being mounted on the shaft to rotate the sprocket wheel step by step, to feed said one terminal at a time, to said insertion station, under the action of a pawl provided with means for adjusting its stroke.

11. A machine for inserting electrical sockets mounted to a carrier strip into holes in a circuit board, the apparatus comprising:
a frame;
a carrier strip feed track on the frame;
a socket driving insertion ram mounted to the frame for vertical reciprocating movement towards and away from a socket insertion station at one end of said feed track, for driving a socket from said carrier strip into a hole in said circuit board;
a circuit board support aligned with the socket insertion station and the ram and being located below said insertion station, for positioning the circuit board to receive a socket to be driven into said hole in the circuit board by the ram;
a carrier strip advancing mechanism on the frame, for advancing the carrier strip intermittently towards said insertion station to position one socket at a time at the socket insertion station, to be driven by the ram into said hole in the circuit board when positioned by said support; and
an elongate tubular guide connected to the frame and through which the ram passes, for guiding said one socket when driven by said ram from the insertion station into said hole, said tubular guide being defined by a pair of half tubes, resilient means surrounding said half tubes at a position remote from said insertion station and urging said half tubes towards each other against the action of said one socket when driven towards said circuit board by said ram, said one socket thereby splaying apart said half tubes against the action of said resilient means as said socket is driven by the ram from the tubular guide into said hole in said circuit board.

12. A machine according to claim 11, wherein the ram is driven by a piston and cylinder unit provided with a threshold sensor arranged to cause said unit to be actuated to drive the ram away from said terminal insertion station should the speed of the ram be reduced to a predetermined extent during its movement towards the terminal insertion station.

13. A machine according to claim 11, wherein the ram is driven by a piston and cylinder unit provided with a threshold sensor arranged to actuate a valve to cause said unit to drive the ram away from the socket insertion station should the speed of the ram be reduced to a predetermined extend during its movement towards the socket insertion station.

* * * * *

UNITED STATES PATENT OFFICE
CERTIFICATE OF CORRECTION

Patent No. 4,914,811　　　　　　　　　　Dated April 10, 1990

Inventor(s) Edward F. Nolte, Jr.

It is certified that error appears in the above-identified patent and that said Letters Patent is hereby corrected as shown below:

In claim 7, column 9, line 34, the word "form" should be --from--.

Signed and Sealed this

Fourth Day of February, 1992

Attest:

HARRY F. MANBECK, JR.

*Attesting Officer*　　　　　　　*Commissioner of Patents and Trademarks*